(12) United States Patent
Furuyama et al.

(10) Patent No.: US 7,312,520 B2
(45) Date of Patent: Dec. 25, 2007

(54) INTERFACE MODULE FOR CONNECTING LSI PACKAGES, AND LSI-INCORPORATING APPARATUS

(75) Inventors: Hideto Furuyama, Yokohama (JP); Hiroshi Hamasaki, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 137 days.

(21) Appl. No.: 11/233,175

(22) Filed: Sep. 23, 2005

(65) Prior Publication Data

US 2006/0192278 A1    Aug. 31, 2006

(30) Foreign Application Priority Data

Feb. 28, 2005    (JP)    ............... 2005-052709

(51) Int. Cl.
  H01L 23/48    (2006.01)
  H01L 29/22    (2006.01)
  H01L 31/0232  (2006.01)

(52) U.S. Cl. ............ 257/688; 257/698; 257/98; 257/432; 257/702; 257/E25.032

(58) Field of Classification Search .......... 257/98, 257/432, 688, 703, 698, 702, E25.032
See application file for complete search history.

(56) References Cited

U.S. PATENT DOCUMENTS 6,864,553 B2 *  3/2005  Epitaux et al. ............ 257/433
7,048,450 B2 *  5/2006  Beer et al. ................. 385/88
2005/0056851 A1 *  3/2005  Althaus et al. ........... 257/81
2005/0156304 A1    7/2005  Furuyama et al.
2006/0022289 A1 *  2/2006  Badhei et al. ............ 257/432
2006/0192278 A1    8/2006  Furuyama et al.

FOREIGN PATENT DOCUMENTS

JP    2004-253456    9/2004

OTHER PUBLICATIONS

"Advanced Optical Modules for Electric Transmission", Nikkei Electonics, Dec. 3, 2001, pp. 118-127.
U.S. Appl. No. 11/496.446, filed Aug. 1, 2006, Furayama, et al.

* cited by examiner

Primary Examiner—Nitin Parekh
(74) Attorney, Agent, or Firm—Oblon, Spivak, McClelland, Maier & Neustadt, P.C.

(57) ABSTRACT

An interface module for connecting LSI packages includes a connecting member which is to be mounted on an LSI package including an LSI chip and which includes lines to be electrically connected to the LSI package, an optoelectronic transducer which is mounted on the connecting member, which is connected to the lines of the connecting member, and which converts optical signal to electric signal or converts electric signal to optical signal, an optical waveguide which includes an optical input end and an optical output end, one of which is optically connected to the optoelectronic transducer, and a reinforcing film which is adhered to the optical waveguide, covering at least one side of the optical waveguide, and which is secured at one end to the connecting member.

22 Claims, 4 Drawing Sheets

INTERFACE MODULE FOR CONNECTING LSI PACKAGES, AND LSI-INCORPORATING APPARATUS

CROSS-REFERENCE TO RELATED APPLICATIONS

This application is based upon and claims the benefit of priority from prior Japanese Patent Application No. 2005-052709, filed Feb. 28, 2005, the entire contents of which are incorporated herein by reference.

BACKGROUND OF THE INVENTION

1. Field of the Invention

The present invention relates to an interface module for use in LSI packages, for connecting a plurality of high-speed signal-processing LSIs, and to an LSI-incorporating apparatus that has the interface module.

2. Description of the Related Art

In recent years, LSI packages have been proposed, in which a module of optical-connector type connects the LSIs and the optical waveguides can therefore be disconnected from the LSIs (see Nikkei Electronics No. 810, p. 122, FIG. 4, Dec. 3, 2001). Apparatuses have been proposed, in which an LSI package and an interface module can be electrically connected and disconnected and optical waveguides (e.g., optical fibers) are directly connected to the interface module (see Jpn. Pat. Appln. KOKAI Publication 2004-253456).

The LSI package disclosed in Nikkei Electronics No. 810 can hardly be mounted on a printed circuit board in the same way as ordinary LIS packages. To mount the package incorporating an optical module of connector type on the board, special steps must be performed in view of the optical axis displacement due to the heat resistance and heat hysteresis of the optical module and the difference in thermal expansion between the LSI package substrate and the optical module. Further, special solder must be used at specific temperatures in order to mount the package on the board. It is therefore difficult to amount the optical module on the printed circuit board in the mass-production line. Moreover, an optical connector must be used to connect the LSI package to the printed circuit board permanently, so that the optical waveguides may be disconnected when necessary. The use of the optical connector inevitably increases the material cost and process cost very much.

Neither material cost nor process cost would not increase so much in the manufacture of the apparatus disclosed in Jpn. Pat. Appln. KOKAI Publication 2004-253456 as in the manufacture of an LSI package mounted on a printed circuit board. However, the optical waveguides may fail to support the interface module, which is relatively heavy. The optical waveguides will be broken if the interface module is handled in an inappropriate manner. Other lines that need not be optically connected by all means, such as lines for supplying low-speed signals, e.g., control signals, are provided on a printed circuit board and electrically connected to the LSI package. Since these lines have different lengths on the printed circuit board, the control timing may shift. Further, these lines may pick up noise (power-supply noise, switching noise and the like), possibly causing the LSI package to malfunction.

BRIEF SUMMARY OF THE INVENTION

According to a first aspect of this invention, there is provided an interface module for connecting LSI packages, comprising:

a connecting member which is to be mounted on an LSI package including an LSI chip, the connecting member including lines to be electrically connected to the LSI package;

an optoelectronic transducer which is mounted on the connecting member, and connected to the lines of the connecting member, the optoelectronic transducer converting optical signal to electric signal or converting electric signal to optical signal;

an optical waveguide which includes an optical input end and an optical output end, one of which is optically connected to the optoelectronic transducer; and a reinforcing film which is adhered to the optical waveguide, covering at least one side of the optical waveguide, the reinforcing film being secured at one end to the connecting member.

According to a second aspect of the invention, there is provided an interface module for connecting LSI packages, comprising:

a first connecting member which is to be mounted on a first LSI package, the first connecting member including lines to be electrically connected to the first LSI package;

a second connecting member which is to be mounted on a second LSI package, the second connecting member including lines to be electrically connected to the second LSI package;

first and second optoelectronic transducers which are mounted on the first connecting member and the second connecting member, respectively, which are connected to the lines of the first connecting member and the lines of the second connecting member, respectively, each of the first and second optoelectronic transducers converting optical signal to electric signal or converting electric signal to optical signal;

an optical waveguide which includes an optical input end and an optical output end, one of which is optically connected to the first optoelectronic transducer, the other of which is optically connected to the second optoelectronic transducer; and a reinforcing film which is adhered to the optical waveguide, covering at least one side of the optical waveguide, the reinforcing film being secured at one end to the first connecting member and at the other end to the second connecting member.

According to a third aspect of the invention, there is provided an LSI-incorporating apparatus comprising:

a mounting substrate a first LSI package which includes an LSI chip and which is mounted on the mounting substrate;

a second LSI package which includes an LSI chip and which is mounted on the mounting substrate; and an interface module which is mounted on the first LSI package and the second LSI package, and which optically connects the first LSI package and the second LSI package, the interface module including:

a first connecting member which is mounted on the first LSI package, the first connecting member including lines electrically connected to the first LSI package;

a second connecting member which is mounted on the second LSI package, the second connecting member including lines electrically connected to the second LSI package;

first and second optoelectronic transducers which are mounted on the first connecting member and the second connecting member, respectively, which are connected to the lines of the first connecting member and the lines of the second connecting member, respectively, the first and second optoelectronic transducers converting optical signal to electric signal or converts electric signal to optical signal;

an optical waveguide which includes an optical input end and an optical output end, one of which is optically connected to the first optoelectronic transducer, the other of which is optically connected to the second optoelectronic transducer; and a reinforcing film which is adhered to the optical waveguide, covering at least one side of the optical waveguide, the reinforcing film being secured at one end to the first connecting member and at the other end to the second connecting member.

DETAILED DESCRIPTION OF THE INVENTION

A condition will first be explained, in which the optical waveguides (e.g., optical fibers) directly secured to an interface module to connect LSI packages may likely be broken if the interface module can be disconnected from the LSI packages.

Figure 10:
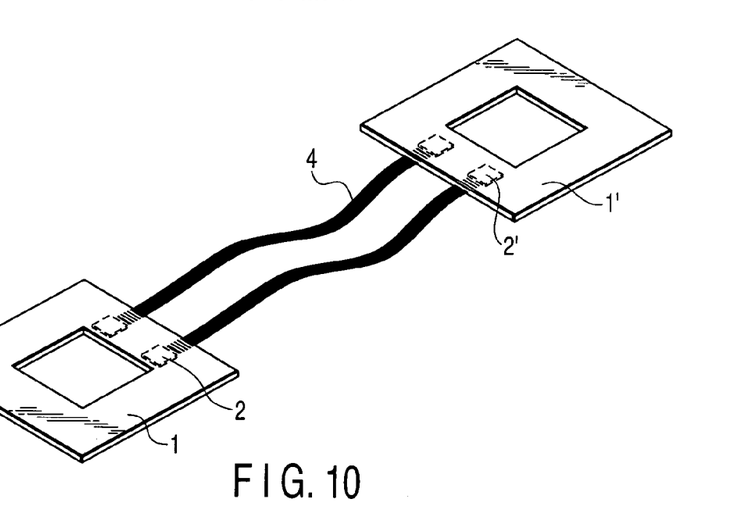
FIG. 10 is a perspective view illustrating an interface module for optically connecting two LSI packages.

FIG. 10 shows an interface module for optically connecting two LSI packages. As FIG. 10 shows, the interface module has connecting plates 1 and 1', optoelectronic transducer units 2 and 2', and ribbon optical fibers 4. The connecting plates 1 and 1' are to be mounted on the two LSI packages, respectively. The optoelectronic transducer units 2 and 2' can convert optical signal to electric signal and vice versa. The ribbon optical fibers 4 function as optical waveguides.

One of the LSI package (not shown) is electrically connected to the interface module by an electrode (not shown) provided on the LIS package and a wire (not shown) provided on the connecting plate 1. Through these, electric signals can be exchanged between the LSI package and the interface module. The optoelectronic transducer units 2 are driven with electrical signals supplied through a wire provided on the connecting plate 1. The other LSI package (not shown) is connected to the interface module in the same way as the first-mentioned LSI package. The ribbon optical fibers 4 connect the optoelectronic transducer units 2 and 2'. Thus, optical waveguides connect the two LSI packages.

Figure 11:
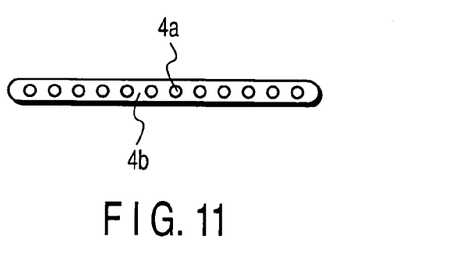
FIG. 11 is a sectional view schematically showing the optical waveguides used in the fifth embodiment.

The ribbon optical fibers 4 have the sectional structure shown in FIG. 11, as in most cases. As seen from FIG. 11, each ribbon optical fiber 4 has optical fiber elements 4a and a sheath 4b. Each fiber element 4a has a coaxial structure composed of a core and a cladding, though not illustrated. The core is the light-guiding part. The cladding covers the core, confining light within the core. The sheath 4b is a resin layer, binding the optical fiber elements 4a and optically insulating the elements 4a from one another. The sheath 4b may have a double-sheath structure. In this case, the sheath 4b consists of inner sheaths that cover the individual fiber elements 4a and an outer sheath that binds the inner sheaths together.

So configured as described above, the interface module can connect two LSI packages, by using optical waveguides. If only one of the connecting plates 1 and 1' is lifted in handling the interface module, the optical fibers 4 will be pulled, because the weight of the other connecting plate acts on it or because something holds the other connecting plate. If the connecting plate 1 and the optical fibers 4 extend in the same plane as illustrated in FIG. 10, the fibers 4 will not be broken or any other problem will not arise. If the optical fibers 4 extend at right angles to the connecting plate 1, however, they will be broken in most cases, because their end parts are bend at an acute angle to the connecting plate 1.

In view of this, it is desired that the connecting plate 1 be made of such material and in such structure as to be as light as possible. Even if the connecting plate 1 is light, the optical fibers 4 will be broken when something holds the other connecting plate 1'. The optical waveguides may not be optical fibers as described above. They may be, for example, optical waveguide films. this case, too, a similar problem will arise. The present invention can prevent the optical waveguides from being broken in such a manner as specified above. Embodiments of the invention will be described below.

First Embodiment

Figure 1:
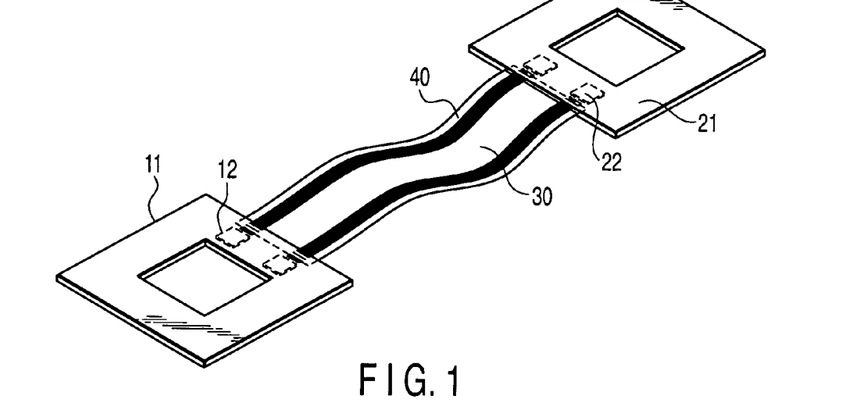
FIG. 1 is a perspective view schematically showing an interface module according to a first embodiment of the present invention.

FIG. 1 is a perspective view schematically showing an interface module according to the first embodiment of the invention, which is designed to connect LSI packages.

As FIG. 1 depicts, the interface module comprises connecting plates 11 and 21, optoelectronic transducer units 12 and 22, a reinforcing film 30, and ribbon optical fibers 40 (optical waveguides). The connecting plates 11 and 21 are flat plates, which are mounted on the two LSI packages (not shown), respectively. The optoelectronic transducer units 12 are provided on one side of the first connecting plate 11. The optoelectronic transducer units 22 are provided on one side of the second connecting plate 21. The first connecting plate 11 and the second connecting plate 21 are spaced apart, with their sides having the optoelectronic transducer units 12 and 22, respectively, opposed to each other.

The connecting plates 11 and 21 comprise, for example, a glass epoxy substrate (e.g., FR-4 grade defined by the UL Standards) and electric wires. Each connecting plate has an opening in the center part. The LSI of an LSI package can be inserted and held in the opening. The optoelectronic transducer units 12 and 22 comprise, for example, an optical element and a driving IC and an optical fiber. The optical element is a surface-input/output element such as a vertical cavity surface emitting laser diode (VCSEL) or a P-I-N photodiode (PIN-PD). The optical element and the optical fiber are optically coupled in direct butt joint. The optical element is connected to a driving IC (not shown) in the optoelectronic transducer unit. Electric wires (not shown) connect the optoelectronic transducer units 12 and 22 to the electrodes provided in the LSI packages. Each optoelectronic transducer unit may have a plurality of surface-input/output optical element. Alternatively, it may have input optical elements and output optical element.

Each ribbon optical fiber 40 is a one-dimensional array of multi-mode optical fiber elements of graded index type, each having a core diameter of 50 µm and a cladding diameter 125 µm. The multi-mode optical fiber elements are arranged at a pitch of 250 µm. The reinforcing film 30 is composed of, for example, two polyimide films (e.g., 100 µm thick). The polyimide films are laid on the ribbon optical fibers 40, respectively from above and from below. The reinforcing film 30 is secured at one end to the connecting plate 11 and at the other end to the connecting plate 21.

Figure 2:
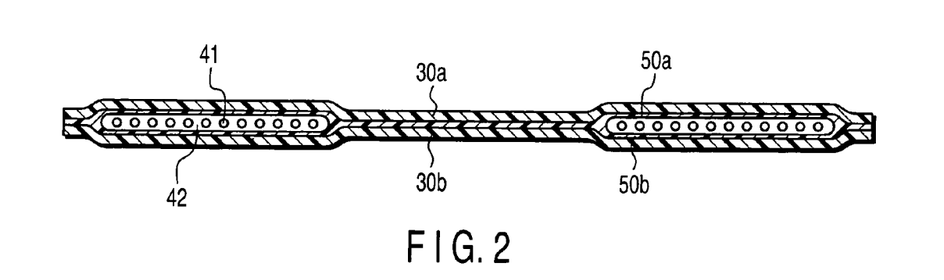
FIG. 2 is a sectional view of the optical waveguides used in the first embodiment.

The reinforcing film 30 and the ribbon optical fibers 40 may be configured as is illustrated in FIG. 2. As FIG. 2 shows, each optical fiber 40 comprises optical fiber elements 41 and a resin sheath 42. Each optical fiber element has a coaxial structure composed of a core and a cladding, though not illustrated. The core is the light-guiding part. The cladding covers the core, thus confining light within the core. The sheath 42 is a resin layer, binding the optical fiber elements 41 and optically insulating the elements 41 from one another. The sheath 42 may have a double-sheath structure. If this is the case, the sheath 42 consists of inner sheaths that cover the individual fiber elements 41 and an outer sheath that binds the inner sheaths together.

In FIG. 2, reference numerals 30a and 30b designate the two polyimide films that constitute the reinforcing film 30. The polyimide films 30a and 30b are, for example, 100 µm thick. The polyimide films 30a and 30b are adhered to each other, with adhesive layers 50a and 50b. The adhesive layers 50a and 50b are adhesive films made of, for example, silicone- or acrylic-based adhesive and having thickness of 50 µm. The polyimide films 30a and 30b may be provided as members independent of the adhesive layers 50a and 50b. Alternatively, the polyimide films 30a and 30b may be combined with the adhesive layers 50a and 50b, respectively, thus providing two adhesive sheets. The reinforcing film 30 may have its ends bonded to, or buried in, the connecting plates 11 and 21, respectively. The ends of the reinforcing film 30 are secured to the connecting plates 11 and 21, having a tensile strength of, for example, 25 N or more.

Figure 3A:
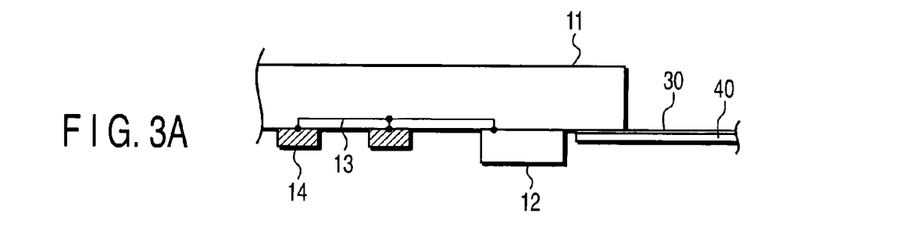
FIGS. 3A and 3B are sectional views schematically depicting a connecting plate used in the first embodiment.
Figure 3B:
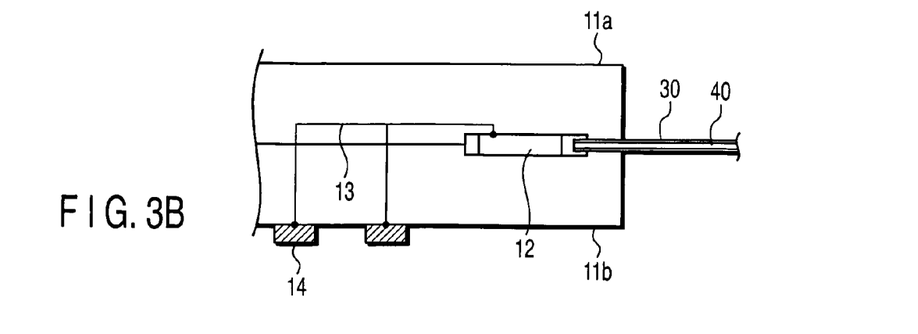

FIGS. 3A and 3B are sectional views schematically depicting the connecting plate 11. More correctly, FIG. 3A shows a connecting plate 11 that has the reinforcing film 30 bonded to a major surface of the plate 11 and FIG. 3B shows a connecting plate that has a part of the reinforcing film 30 held in it.

To bond the reinforcing film 30 to one major surface of the connecting plate 11 as shown in FIG. 3A, it suffices to form a wire 13 on that surface of the plate 11 on which the optoelectronic transducer units 12 are provided, and to provide electrode pads 14 on parts of the wire 13. Note that the electrode pads 14 are to be connected to the electrodes of an LSI package. To bury a part of the reinforcing film 30 in the connecting plates 11 as illustrated in FIG. 3B, the wire 13 is first provided in the connecting plate 11 and led out of the lower surface of the connecting plate 11 through a via plug or the like. Thus, electrode pads 14 to be connected to the electrodes of the LSI package are provided at those parts of the wire 13 that have been led out.

The interface module according to this embodiment can be disconnected from LSI packages and has ribbon optical fibers 40 (i.e., optical waveguides) that are directly secured to the connecting plates 11 and 21 and used as optical waveguides. Further, the interface module has a reinforcing film 30, which reinforces the optical waveguides. Moreover, the connecting plates 11 and 21, which are the main parts of the module, hold the reinforcing film 30. This can prevent the fibers from being broken at the junctions between the connecting plates 11 and 21 and the ribbon optical fibers 40 (for example, when they are bent at an acute angle to the connecting plates 11 and 21).

To demonstrate the advantage of preventing the breakage of the optical fibers, the inventors hereof conducted experiments.

In the experiments, a ribbon optical fiber of the conventional type was prepared. This ribbon optical fiber has a thickness of 270 µm, including the thickness of the resin sheath. It is a one-dimensional 12 array of multi-mode optical fiber elements of graded index type, arranged at a pitch of 250 µm, each having a core diameter of 50 µm and a cladding diameter 125 µm. The ribbon optical fiber was subjected to a tensile-strength test. In the test, the ribbon optical fiber was bent at right angle by using an aluminum block that has corners having a radius of curvature of 0.1 mm. The optical fiber, which has no reinforcing film like a conventional ribbon optical fiber, was broken at a tensile force of about 20 N. A ribbon optical fiber according to the first embodiment of this invention, which has polyimide films 30a and 30b and adhesive layers 50a and 50b (total thickness is 70 µm), unlike the convention type, was bent in the same way as the conventional one. It was broken at a tensile force of about 50 N or more.

The ribbon optical fibers of these two types were interposed, in part, between two parallel flat plates and then bent, while changing the gap between the flat plates. The gap the plates had between them when the conventional optical fiber was broken was measured. The gap the plates had between them when the optical fiber according to the first embodiment was broken was measured, too. Both gaps were about 2.5 mm, which means that the reinforcing film has nothing to do with the breakage gap. In view of this, the ribbon optical fibers of the two types were bent around a round bar having a diameter of 1.6 mm, which is smaller than the breakage gap, then straightened and again bent by 180°. Thus, the tensile strengths at which the ribbon optical fibers were broken were measured. The optical fiber of the conventional type, which has no reinforcing film, had tensile strength of about 5 N. The optical fiber according to the first embodiment, which has polyimide films and adhesive layers (total thickness is 70 µm) had tensile strength of about 18 N, more than three times as strong as the optical fiber of the conventional type.

The results of the experiments show that the reinforcing film 30 increases the bending strength of the ribbon optical fibers 40. Hence, the ribbon optical fibers 40 can hardly be broken, particularly at the parts secured to the connecting plates 11 and 21. The reinforcing film 30 can render the optical fibers 40 sufficiently resistant to a bending force, even if it is provided on only one side of the optical fibers 40. Preferably, the reinforcing film 30 covers both sides of the ribbon optical fibers 40 so that the fibers 40 may hardly be broken, whether it is bent upward or downward.

The interface module according to the first embodiment, described above, can be manufactured by the following method. At first, the ribbon optical fibers 40 are secured to the two optoelectronic transducer units 12 and to the two optoelectronic transducer units 22 that face the units 12. Then, the optoelectronic transducer units 12 are mounted on the connecting plate 11, and the optoelectronic transducer unit 22 on the connecting plate 21. Thereafter, the reinforcing film 30 is bonded to the ribbon optical fibers 40.

The sequence of manufacturing a printed circuit board may be applied to manufacture the interface module. That is, substrate each having an opening (in which optical waveguides, such as optical fibers, will be provided) are laid one on another. For example, the first layer, i.e., lower substrate forming the connecting plates 11 and 21 is prepared. Then, the second layer forming the lower polyimide film 30b, the third layer forming the optoelectronic transducer units 12 and 22 and optical waveguides is laid on the second layer. The fourth layer forming the upper polyimide film 30a is laid on the third layer. Finally, the fifth layer, i.e., upper substrate forming the connecting plates 11 and 21 is laid on the fourth layer. This method can manufacture a plurality of interface modules at a time.

This means that the method of manufacturing a so-called rigid-flex substrate can be employed. Namely, the manufacturing cost and mass-productivity can be much enhanced, while maintaining the ability of the optical waveguides, i.e., the ability of transmitting data in large quantities and at high speeds. Hence, the interface module can greatly contribute to the sophistication of data-communications apparatuses. The interface module according to this embodiment can therefore be mounted on the printed circuit board for LSI packages, in the same manner and at the same time as ordinary LSI packages. Moreover, the interface module can prevent the breakage of optical waveguides and can reduce the manufacturing cost of data-communications apparatuses.

Second Embodiment

Figure 4:
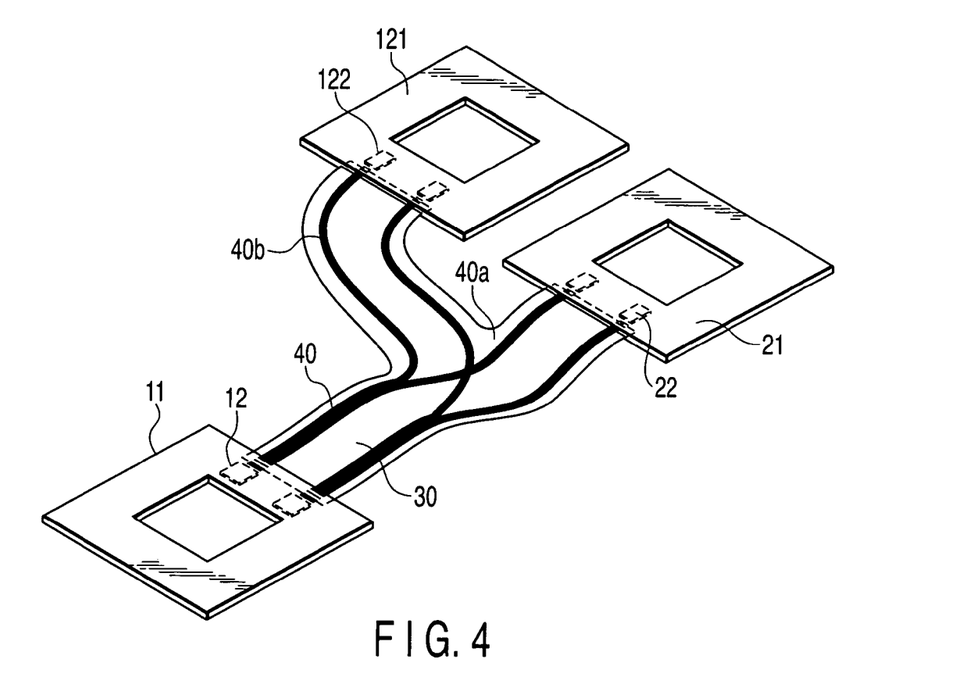
FIG. 4 is a perspective view schematically illustrating an interface module according to a second embodiment of the present invention.

FIG. 4 is a perspective view that schematically illustrates an interface module according to the second embodiment of the present invention. The components identical to those shown in FIG. 1 are designated at the same reference numerals and will not be described in detail.

This embodiment is characterized in two respects. First, each ribbon optical fiber 40 is divided at the middle into two branches. Second, each branch is connected to a connecting plate. To be more specific, each ribbon optical fiber 40 is divided at the middle into fiber branches 40a and 40b, and the fiber branch 40a is connected to a connecting plate and the fiber branch 40b to another connecting plate.

Still more precisely, the fiber branch 40a is connected to the optoelectronic transducer units 22 provided on the second connection plate 21. The fiber branch 40b is connected to the optoelectronic transducer units 122 provided on the third connection plate 121. The fiber branches 40a and 40b of each optical fiber 40 are sealed in two reinforcing films 30, respectively, in the same way as the remaining part of the ribbon optical fiber 40 is sealed.

Thus configured, the second embodiment can achieve the same advantages as the first embodiment. In addition, the interface module according to the second embodiment can connect three LSI packages, not two. Each ribbon optical fiber 40 may be divided into more fiber branches. In this case, the interface module can connect more LSI packages.

Third Embodiment

Figure 5:
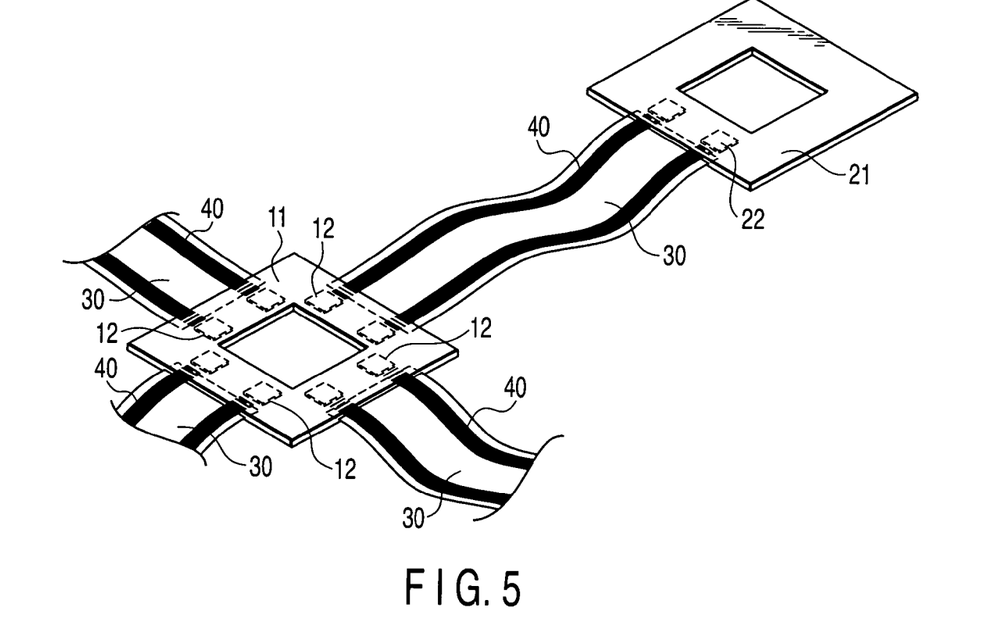
FIG. 5 is a perspective view schematically showing an interface module according to a third embodiment of this invention.

FIG. 5 is a perspective view that schematically depicts an interface module according to the third embodiment of this invention. The components identical to those shown in FIG. 1 are designated at the same reference numerals and will not be described in detail.

The third embodiment is characterized in two respects. First, optoelectronic transducer units 12 are provided, not on one side of the rectangular connecting plate 11, but on the four sides thereof. Second, four reinforcing films 30 and four ribbon optical fibers 40 are connected to the four sets of transducer units 12, respectively. Note that each reinforcing film 30 and the optical fibers 40 sealed in the film 30 extend at right angles to one side of the connecting plate 11.

The interface module according to the third embodiment can connect many LSI packages to one LSI package.

Fourth Embodiment

Figure 6A:
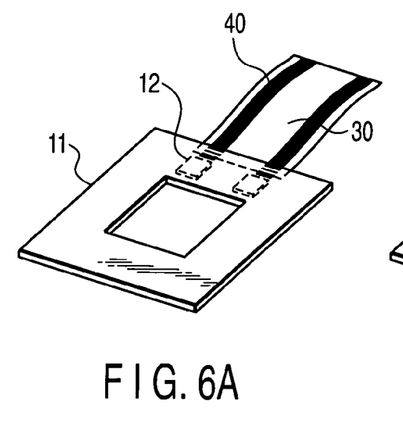
FIGS. 6A and 6B are perspective views schematically depicting an interface module according to a fourth embodiment of the present invention.
Figure 6B:
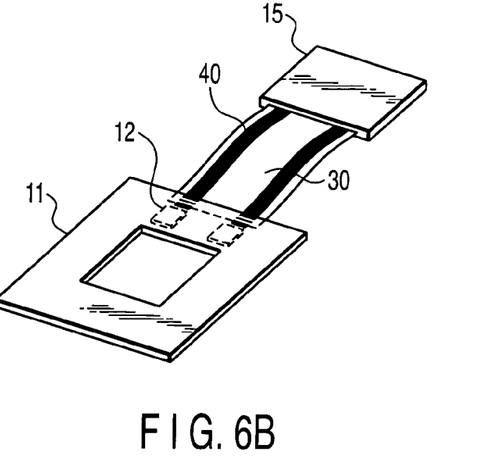

FIGS. 6A and 6B are perspective views that schematically show an interface module according to the fourth embodiment of the present invention. The components identical to those shown in FIG. 1 are designated at the same reference numerals and will not be described in detail.

The fourth embodiment is characterized in that the optical waveguides are connected to one connecting plate 11, not connecting two connecting plates 11 and 21 as in the first to third embodiments. As in the first embodiment, optoelectronic transducer units 12 are provided on the connecting plate 11. Ribbon optical fibers 40 are optically connected at one end to the optoelectronic transducer units 12. A reinforcing film 30 is provided, sealing the ribbon optical fibers 40. The other end of each ribbon optical fiber 30 may be opened as shown in FIG. 6A. Alternatively, it may be connected to an optical connector 15 as is illustrated in FIG. 6B.

The interface module according to the fourth embodiment can connect a device of any type to one LSI package. The interface module of the type shown in FIG. 6A and the interface module of the type shown in FIG. 6B may be used, forming a pair. Then, they can connect two LSI packages.

Fifth Embodiment

Figure 7:
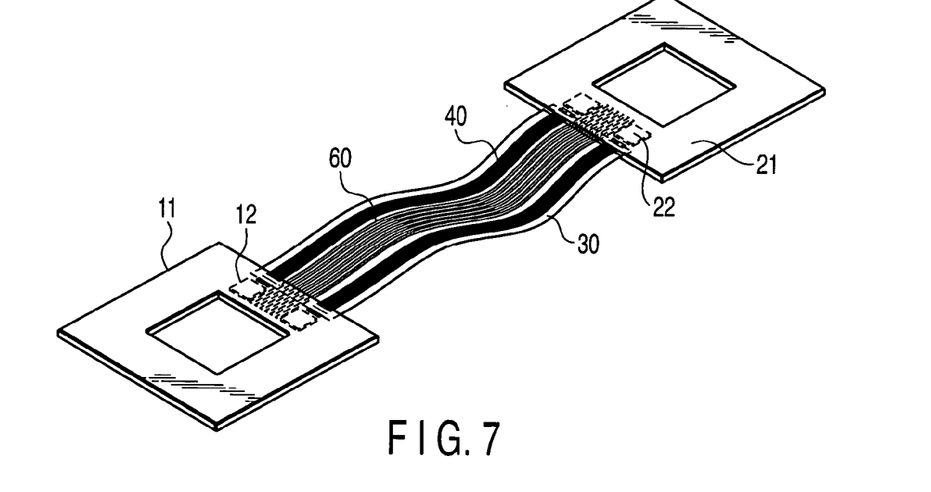
FIG. 7 is a perspective view schematically illustrating an interface module according to a fifth embodiment of the invention.

FIG. 7 is a perspective view that schematically illustrates an interface module according to the fifth embodiment of this invention. The components identical to those shown in FIG. 1 are designated at the same reference numerals and will not be described in detail.

The fifth embodiment is identical in structure to the first embodiment, except that lines are provided, electrically connecting the two connecting plates 11 and 21. More specifically, lines 60 are arranged, extending parallel to the ribbon optical fibers 40. The lines 60 are sealed in the reinforcing film 30, together with the ribbon fibers 40, from above and from below. The lines 60 are, for example, copper-plated wires arranged in a polyimide-film core and having a thickness of 18 μm and a width of 200 μm.

The lines 60 are connected at one end to the lines provided on the connecting plate 11, and at the other end to the lines provided on the connecting plate 21. The reinforcing film 30 is a laminate consisting of, for example, two polyimide films (each 100 μm thick, for example). One of the polyimide films covers the ribbon optical fibers 40 and the lines 60 from above, while the other polyimide film covers the fibers 40 and the lines 60 from below. The reinforcing film 30 is secured at one end to the connecting plate 11, and at the other end to the connecting plate 21.

Figure 8:
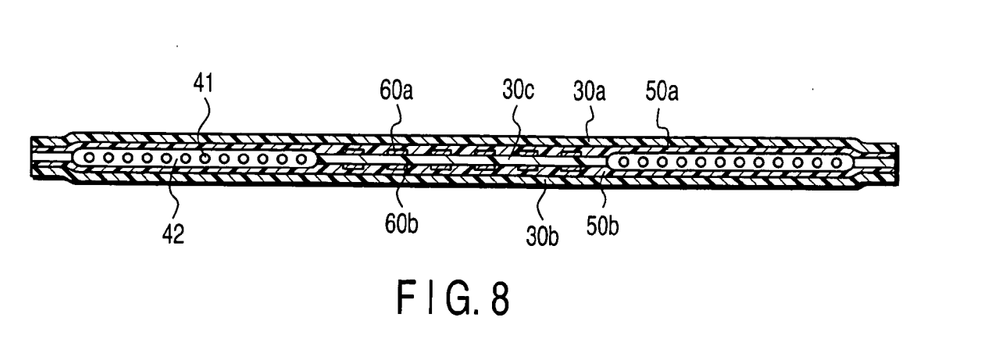
FIG. 8 is a sectional view of the optical waveguides used in the fifth embodiment.

The reinforcing film 30, ribbon optical fibers 40 and lines 60 are arranged as shown in FIG. 8. As FIG. 8 depicts, each ribbon optical fiber 40 comprises fiber elements 41 and a resin sheath 42. Each optical fiber element has a coaxial structure composed of a core and a cladding, though not illustrated. The core is the light-guiding part. The cladding covers the core, thus confining light within the core. The sheath 42 is a resin layer, binding the optical fiber elements 41. The sheath 42 may have a double-sheath structure. If this is the case, the sheath 42 consists of inner sheaths that cover the individual fiber elements 41 and an outer sheath that binds the inner sheaths together.

In FIG. 8, reference numerals 30a and 30b designate the two polyimide films that constitute the reinforcing film 30. The polyimide films 30a and 30b are, for example, 100 μm thick. The polyimide films 30a and 30b are adhered to each other, with adhesive layers 50a and 50b. The adhesive layers 50a and 50b are adhesive films made of, for example, silicone- or acrylic-based adhesive and having thickness of 50 μm. The polyimide films 30a and 30b may be provided as members independent of the adhesive layers 50a and 50b. Alternatively, the polyimide films 30a and 30b may be combined with the adhesive layers 50a and 50b, respectively, thus providing two adhesive sheets.

In FIG. 8, reference numeral 30c denotes an electrical-line core. The core 30c is a polyimide film having a thickness of, for example, 50 μm. Electric lines 60a are provided on one side of the core 30c, and electric lines 60b are provided on the other side of the core 30c. These lines 60a and 60b are dedicated to the electrical connection of LSI packages. The lines 60a and 60b are long copper strips that are, for example, 18 μm thick and 20 μm wide. The reinforcing film 30 may have its ends bonded to, or buried in, the connecting plates 11 and 21, respectively. The ends of the reinforcing film 30 are secured to the connecting plates 11 and 21, having a tensile strength of, for example, 25 N or more.

So configured as described above, the interface module according to the fifth embodiment can prevent the optical waveguides from being broken at the junctions between them and the connecting plates 11 and 21 (for example, when the optical waveguides are bent at an acute angle to the connecting plates 11 and 21). Furthermore, the lines 60 are dedicated to exchange of electric signals between the LSI packages. Hence, low-speed signals, such as control signals supplied through the lines 60 are hardly influenced by the noise emanating from other components.

The interface module according to the fifth embodiment, described above, can be manufactured by the following method. First, the ribbon optical fibers 40 are secured to the two optoelectronic transducer units 12 and to the two optoelectronic transducer units 22 that face the units 12. Then, the optoelectronic transducer units 12 are mounted on the connecting plate 11, and the optoelectronic transducer unit 22 on the connecting plate 21. Thereafter, the lines 60 are connected to the connecting plates 11 and 21. Finally, the reinforcing film 30 is bonded to the ribbon optical fibers 40.

The sequence of manufacturing a printed circuit board may be applied to manufacture the interface module. That is, layers each having an opening (in which optical waveguides, such as optical fibers, will be provided) will be laid one on another. For example, the first layer, i.e., lower substrate forming the connecting plates 11 and 21 is prepared. Then, the second layer forming the lower polyimide film 30b is laid on the lower substrate. The third layer forming the optoelectronic transducer units 12 and 22 and optical waveguides is laid on the second layer. The fourth layer forming the upper polyimide film 30a is laid on the third layer. Finally, the fifth layer, i.e., upper substrate forming the connecting plates 11 and 21 is laid on the fourth layer. This method can manufacture a plurality of interface modules at a time. This means that the method of manufacturing a so-called rigid-flex substrate can be employed.

Sixth Embodiment

Figure 9:
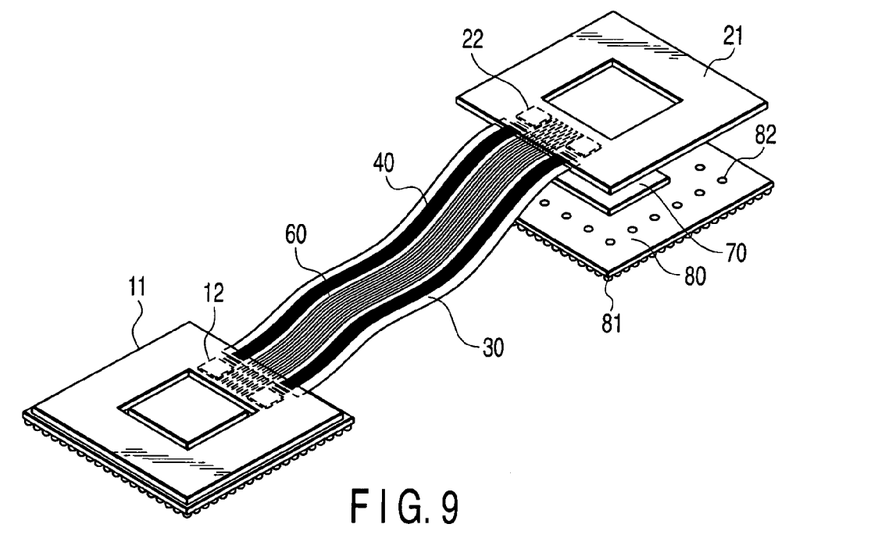
FIG. 9 is a perspective view schematically illustrating an interface module according to a sixth embodiment of the invention.

FIG. 9 is a perspective view that schematically illustrating an interface module according to the sixth embodiment of the invention. The components identical to those shown in FIG. 7 are designated at the same reference numerals and will not be described in detail.

The sixth embodiment is designed to be mounted on an LSI package that is provided on a printed circuit board (not shown). In FIG. 9, reference numerals 70 and 80 denote an LSI chip and an LSI package, respectively. The LSI package 80 has electrodes (solder balls) 81 on the lower surface, and electrodes (electrode pads) 82 on the upper surface. The electrodes 82 surround the LSI chip 70, which is mounted on the upper surface of the LSI package 80, too. The electrodes 82 achieve the electrical connection of the LSI package 80 to the interface module.

The LSI package shown in FIG. 9 is a ball-grid array (BGA). The BGA may be replaced by a pin-grid array (PGA), a land-grid array (LGA), or the like.

The LSI package 80 is mounted on a printed circuit board (not shown), along with other components. As FIG. 9 shows, the connecting plate 21 of the interface module is mounted on the LSI package 80, covering the same from above. The connecting plate 21 has an opening, which aligns with the LSI chip 70 when the plate 21 is mounted on the LSI package 80. The other connecting plate 11 of the interface module has an opening, too, for similar purpose. After the connecting plate 21 is mounted on the LSI package 80, the top of the LSI chip 70 is exposed through the opening. (If the LSI chip 70 is a flip chip, its bottom will be exposed.) This facilitates the heat radiation from the LSI chip 80. If a heat sink is provided on the connecting plate 11 after the plate 11 has been mounted as shown in the left part of FIG. 9, the heat the LSI chip 70 can be efficiently radiated.

As FIG. 9 shows, the optical waveguides connect two LSI packages. Nonetheless, this invention can be applied to connect three or more LSI packages. To connect three or more LSI packages by using the optical waveguides, as many connecting plates as the LSI packages are used. The wiring pattern of the optical waveguides that connect the optoelectronic transducer units provided on the LSI packages is determined from the wiring architectures of the LSI packages.

More specifically, the ribbon optical fibers 40 (i.e., optical waveguides) that extend straight as illustrated in FIG. 9, may be divided into branches as in the second embodiment. Alternatively, the ribbon optical fibers 40 may be connected to four sets of optoelectronic transducer units, which are provided on the four sides of the connecting plate 11, as in the third embodiment. The wiring pattern of the electric lines 60 is determined in a similar way. Nevertheless, the ribbon optical fibers 40 and the electric lines 69 can be independently designed, because the electric lines 60 can extend, crossing the ribbon optical fibers 40 (i.e., optical waveguides). Finally, the ribbon optical fibers 40 (i.e., optical waveguides) and the electric lines 60 are sealed in the reinforcing film 30 with their end parts held in those regions of the connecting plates, where electric leads are provided for the optical waveguides and the electric lines.

Thus, one interface module can optically connect three or more LSI packages. If incorporated in an apparatus, the interface module can greatly enhance the flexibility of the system configuration and component-mounting scheme of the apparatus.

(Modifications)

The present invention is not limited to the embodiments described above. In each embodiment, the components may be replaced by other means (components or materials), in accordance with the gist of the invention. The materials, shapes and positions of the components of each embodiment are nothing more than examples. Further, the embodiments described above can be used in any possible combinations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An interface module for connecting LSI packages, comprising:
    a connecting member which is to be mounted on an LSI package including an LSI chip, the connecting member including lines to be electrically connected to the LSI package;
    an optoelectronic transducer which is mounted on the connecting member, and connected to the lines of the connecting member, the optoelectronic transducer converting optical signal to electric signal or converting electric signal to optical signal;
    an optical waveguide which includes an optical input end and an optical output end, one of which is optically connected to the optoelectronic transducer and is secured to the connecting member; and
    a reinforcing film which is provided along the waveguide and adhered to the optical waveguide, covering at least one side of the optical waveguide, the reinforcing film being secured at one end to the connecting member.

2. The interface module according to claim 1, further comprising an electric path which extends along the optical waveguide, at least one side of the electric path being covered with and adhered to the reinforcing film together with the optical waveguide.

3. The interface module according to claim 1, wherein the connecting member is formed of at least two layers bonded together, and the optical waveguide and the reinforcing film are held, in part, between the two layers.

4. The interface module according to claim 1, wherein the optoelectronic transducer is buried in the connecting member.

5. The interface module according to claim 1, wherein the optoelectronic transducer includes a first optoelectronic transducer element converting optical signal to electric signal and a second optoelectronic transducer element converting electric signal to optical signal, and optical waveguides are connected to the first and second optoelectronic transducer elements, respectively.

6. The interface module according to claim 1, wherein the reinforcing film is formed of two film members, and the optical waveguide is interposed between the film members.

7. The interface module according to claim 1, wherein a plurality of optoelectronic transducers including the optoelectronic transducer and a plurality of optical waveguides including the optical waveguides are provided, and the optoelectronic transducers are provided at different positions of the connecting member, and each of the optical waveguides is connected with each of the optoelectronic transducers respectively.

8. The interface module according to claim 1, wherein the connecting member includes an opening in a center part, and the opening is larger than the LSI chip.

9. The interface module according to claim 1, wherein the optical waveguide comprises a plurality of ribbon optical fibers that extend parallel to one another.

10. An interface module for connecting LSI packages, comprising:
    a first connecting member which is to be mounted on a first LSI package, the first connecting member including lines to be electrically connected to the first LSI package;
    a second connecting member which is to be mounted on a second LSI package, the second connecting member including lines to be electrically connected to the second LSI package;
    first and second optoelectronic transducers which are mounted on the first connecting member and the second connecting member, respectively, which are connected to the lines of the first connecting member and the lines of the second connecting member, respectively, each of the first and second optoelectronic transducers converting optical signal to electric signal or converting electric signal to optical signal;
    an optical waveguide which includes an optical input end and an optical output end, one of which is optically connected to the first optoelectronic transducer, the other of which is optically connected to the second optoelectronic transducer; and
    a reinforcing film which is adhered to the optical waveguide, covering at least one side of the optical waveguide, the reinforcing film being secured at one end to the first connecting member and at the other end to the second connecting member.

11. The interface module according to claim 10, wherein the optical waveguide is divided at a middle part into branches, and which further includes another connecting member connected to one of the branches.

12. The interface module according to claim 10, further comprising an electric path which extends along the optical waveguide, at least one side of the electric path being covered with and adhered to the reinforcing film together with the optical waveguide.

13. The interface module according to claim 10, wherein each of the first connecting member and the second connecting member is formed of at least two layers bonded together, and the optical waveguide and the reinforcing film are held, in part, between the two layers.

14. The interface module according to claim 10, wherein the optoelectronic transducers are buried in the first connecting member and the second connecting member, respectively.

15. The interface module according to claim 10, wherein each of the first and second optoelectronic transducers includes a first optoelectronic transducer element converting optical signal to electric signal and a second optoelectronic transducer element converting electric signal to optical signal, and a plurality of optical waveguides including the optical waveguide are provided to the first optoelectronic transducer element to the second optoelectronic transducer element, respectively.

16. The interface module according to claim 10, wherein the reinforcing film is formed of two film members, and the optical waveguide is interposed between the film members.

17. The interface module according to claim 10, wherein a plurality of optoelectronic transducers including the first optoelectronic transducer and a plurality of optoelectronic transducers including the second optoelectronic transducer are prepared at different positions of the first connecting member and the second connecting member respectively, and a plurality of optical waveguide including the optical waveguide are connected with the first and second optoelectronic transducers respectively.

18. The interface module according to claim 10, wherein each of the first connecting member and the second connecting member includes an opening in a center part, and the opening being larger than the first LSI package and the second LSI package, respectively.

19. The interface module according to claim 10, wherein the optical waveguide comprises a plurality of ribbon optical fibers that extend parallel to one another.

20. An LSI-incorporating apparatus comprising:
a mounting substrate
a first LSI package which includes an LSI chip and which is mounted on the mounting substrate;
a second LSI package which includes an LSI chip and which is mounted on the mounting substrate; and
an interface module which is mounted on the first LSI package and the second LSI package, and which optically connects the first LSI package and the second LSI package, the interface module including:
a first connecting member which is mounted on the first LSI package, the first connecting member including lines electrically connected to the first LSI package;
a second connecting member which is mounted on the second LSI package, the second connecting member including lines electrically connected to the second LSI package;
first and second optoelectronic transducers which are mounted on the first connecting member and the second connecting member, respectively, which are connected to the lines of the first connecting member and the lines of the second connecting member, respectively, the first and second optoelectronic transducers converting optical signal to electric signal or converts electric signal to optical signal;
an optical waveguide which includes an optical input end and an optical output end, one of which is optically connected to the first optoelectronic transducer, the other of which is optically connected to the second optoelectronic transducer; and
a reinforcing film which is adhered to the optical waveguide, covering at least one side of the optical waveguide, the reinforcing film being secured at one end to the first connecting member and at the other end to the second connecting member.

21. The LSI-incorporating apparatus according to claim 20, further comprising an electric path which extends along the optical waveguide, at least one side of the electric path being covered with and adhered to the reinforcing film together with the optical waveguide.

22. The LSI-incorporating apparatus according to claim 20, wherein the first LSI package and the second LSI package include module-connecting electrodes to be connected to the lines of the first connecting member and the lines of the second connecting member, on sides on which the LSI chip of the first LSI package and the LSI chip of the second LSI package are provided, and include substrate-connecting electrodes on the opposite sides to the sides on which the LSI chip of the first LSI package and the LSI chip of the second LSI package are provided.

* * * * *